(12) United States Patent
Kawai et al.

(10) Patent No.: US 10,923,372 B2
(45) Date of Patent: Feb. 16, 2021

(54) GAS INJECTION DEVICE

(71) Applicant: SINFONIA TECHNOLOGY CO., LTD., Minato-ku (JP)

(72) Inventors: Toshihiro Kawai, Minato-ku (JP); Yasushi Taniyama, Minato-ku (JP); Munekazu Komiya, Minato-ku (JP); Takashi Shigeta, Minato-ku (JP)

(73) Assignee: SINFONIA TECHNOLOGY CO., LTD., Minato-ku (JP)

( * ) Notice: Subject to any disclaimer, the term of this patent is extended or adjusted under 35 U.S.C. 154(b) by 78 days.

(21) Appl. No.: 15/757,560

(22) PCT Filed: Aug. 19, 2016

(86) PCT No.: PCT/JP2016/074188
§ 371 (c)(1),
(2) Date: Mar. 5, 2018

(87) PCT Pub. No.: WO2017/038490
PCT Pub. Date: Mar. 9, 2017

(65) Prior Publication Data
US 2018/0254209 A1    Sep. 6, 2018

(30) Foreign Application Priority Data

Sep. 4, 2015    (JP) .............................. JP2015-175192

(51) Int. Cl.
*F16K 31/122*    (2006.01)
*H01L 21/673*    (2006.01)
(Continued)

(52) U.S. Cl.
CPC ...... *H01L 21/67389* (2013.01); *F16K 15/028* (2013.01); *F16K 15/147* (2013.01);
(Continued)

(58) Field of Classification Search
CPC ............. H01L 21/67389; H01L 21/677; H01L 21/67772; H01L 21/67775; F16K 15/028; F16K 15/147; F16K 31/1221
(Continued)

(56) References Cited

U.S. PATENT DOCUMENTS 5,169,272 A * 12/1992 Bonora ................. G03F 7/7075
414/217.1
6,152,669 A * 11/2000 Morita .............. H01L 21/67772
414/217
(Continued)

FOREIGN PATENT DOCUMENTS

JP    2002-170876 A    6/2002
JP    2010-182747 A    8/2010
(Continued)

OTHER PUBLICATIONS

International Preliminary Report on Patentability and Written Opinion of the International Searching Authority dated Mar. 6, 2018 in PCT/JP2016/074188, filed Aug. 19, 2016 (with English translation), 8 pages.

(Continued)

*Primary Examiner* — Matthew W Jellett
(74) *Attorney, Agent, or Firm* — Oblon, McClelland, Maier & Neustadt, L.L.P.

(57) ABSTRACT

There is provided a gas injection device configured to prevent entry of atmospheric air when charging gas into a FOUP. In order to realize such a gas injection device, the gas injection device is structured so as to include: a gas supply port 72 through which inert gas is supplied; a nozzle main body 71 including a gas passage 77 communicating with the gas supply port 72; an opening/closing mechanism 92 configured to close the gas supply port 72; and an opener 96 configured to cause the opening/closing mechanism 92 to (Continued)

open the gas supply port 72 closed by the opening/closing mechanism 92.

8 Claims, 14 Drawing Sheets

(51) Int. Cl.
    *F16K 15/14*     (2006.01)
    *H01L 21/677*     (2006.01)
    *F16K 15/02*     (2006.01)

(52) U.S. Cl.
    CPC .... *F16K 31/1221* (2013.01); *H01L 21/67393* (2013.01); *H01L 21/67772* (2013.01); *H01L 21/67775* (2013.01)

(58) Field of Classification Search
    USPC .................................................. 141/63, 349
    See application file for complete search history.

(56) References Cited

U.S. PATENT DOCUMENTS

| | | | | |
|---|---|---|---|---|
| 6,394,733 | B1* | 5/2002 | Toda | H01L 21/67017 406/192 |
| 6,430,802 | B1* | 8/2002 | Miyajima | H01L 21/67373 206/711 |
| 6,641,349 | B1* | 11/2003 | Miyajima | H01L 21/67126 206/711 |
| 7,328,727 | B2* | 2/2008 | Tieben | H01L 21/67379 141/11 |
| 8,596,312 | B2* | 12/2013 | Natsume | H01L 21/67775 141/98 |
| 9,174,253 | B2* | 11/2015 | Natsume | B08B 9/093 |
| 9,701,431 | B2* | 7/2017 | Tominaga | H01L 21/67393 |
| 9,916,997 | B2* | 3/2018 | Morihana | H01L 21/67393 |
| 10,134,619 | B2* | 11/2018 | Kondoh | H01L 21/67389 |
| 2008/0260498 | A1* | 10/2008 | Nagata | H01L 21/67017 414/217 |
| 2011/0214778 | A1 | 9/2011 | Natsume et al. | |

FOREIGN PATENT DOCUMENTS

| | | |
|---|---|---|
| JP | 2011-187539 A | 9/2011 |
| JP | 2012-33702 A | 2/2012 |

OTHER PUBLICATIONS

International Search Report dated Nov. 15, 2016, in PCT/JP2016/074188, filed Aug. 19, 2016.

* cited by examiner

GAS INJECTION DEVICE

TECHNICAL FIELD

The present invention relates to a gas injection device configured to charge nitrogen gas into a container containing wafers being conveyed.

BACKGROUND ART

Semiconductors have been produced by conducting various processes to wafers functioning as substrates. In recent years, semiconductor devices are increasingly highly integrated and circuit patterns are becoming increasingly finer. Due to this, there is a demand to maintain the surroundings of wafers highly clean to prevent particles and/or moisture from being attached to surfaces of wafers. Furthermore, to prevent changes of the property of the surfaces of wafers, such as oxidation of the surfaces, arrangements have been made. For example, nitrogen atmosphere (inert gas atmosphere) or a vacuum state is created around the wafers.

In order to properly maintain the atmosphere around the wafers, the wafers are handled in a hermetically-closable storage pod called a front-opening unified pod ("FOUP"). Into the FOUP, nitrogen is charged. In order to transfer wafers between the FOUP and a processing apparatus configured to process the wafers, equipment called "equipment front end module (EFEM)" is used. The EFEM forms a wafer conveyance chamber substantially closed in a casing. The EFEM includes a load port functioning as an interface unit between the chamber and the FOUP. The load port is provided on one of opposing wall surfaces of the EFEM. A load lock chamber, which is a part of the processing apparatus, is connected to the other of the wall surfaces. A wafer conveyance apparatus configured to convey wafers is provided in the wafer conveyance chamber. Using this wafer conveyance apparatus, wafers are transferred between the FOUP connected to the load port and the load lock chamber. Generally, in the wafer conveyance chamber, a downflow, which is a clean atmospheric air flow, is always sent from a fan filter unit provided at an upper portion of the wafer conveyance chamber.

In some recent cutting-edge processes for wafers, oxygen, moisture, or the like contained in such clean atmospheric air used as the downflow may have a risk of changing the property of wafers. Because of this, it has been required to practically apply the technique of injecting inert gas into the FOUP so that nitrogen atmosphere is created around the wafers, as described in Patent Literature 1, for example.

CITATION LIST

Patent Literature

Patent Literature 1: Japanese Unexamined Patent Publication No. 2011-187539

SUMMARY OF INVENTION

Technical Problem

In a gas injection device described in Patent Literature 1, however, atmospheric air and/or particles still remain in a passage in its injection nozzle. As a result, such remaining atmospheric air and/or particles may unintentionally enter into a FOUP, in which lower oxygen concentration and lower humidity are required. This may disadvantageously change the property of wafers contained therein.

The present invention has been made in order to solve the above-described problem. An object of the invention is to provide a gas injection device configured to prevent entry of atmospheric air when charging inert gas into a FOUP.

Solution to Problem

According to a first aspect, a gas injection device includes: a nozzle main body including a gas supply port through which inert gas is supplied and a gas passage communicating with the gas supply port; an opening/closing mechanism configured to open/close the gas supply port; and an opener configured to cause the opening/closing mechanism to open the gas supply port closed by the opening/closing mechanism.

With this gas injection device, the atmospheric air remaining in the gas passage is preventable from entering into a container to which inert gas is supplied, by opening the gas supply port closed by the opening/closing mechanism after the gas in the gas passage is discharged. Note that, the "atmospheric air" herein means one or more substances that can change the property of wafers (e.g., oxygen causes oxidation of wafers contained in the container), and gas containing such substances. Such substances can be, but not limited to, oxygen, moisture, and particles. Because the entry of the atmospheric air into the container is prevented, it is possible to prevent the change of the property of the wafers contained in the container. Furthermore, the opener causes the opening/closing mechanism to open the closed gas supply port, and this allows inert gas to be easily supplied through the gas supply port.

According to a second aspect, the gas injection device is arranged such that the nozzle main body includes: a barrel portion forming the gas supply port; an upper space provided in an upper portion of the barrel portion; and a lower space provided in a lower portion of the barrel portion, the opening/closing mechanism includes: a lid portion provided in the upper space and configured to cover a perimeter of the gas supply port with an outer circumferential edge portion of the lid portion; and an elongate portion extending from the lid portion to the lower space through the barrel portion, and the opener includes a support portion provided in and around the lower space so as to be movable in an up-down direction relative to the barrel portion and configured to move a lower end of the elongate portion upward.

In this gas injection device, merely by moving the opener upward, the opening/closing mechanism also moves upward, so that the gas supply port closed by the lid portion is opened. Thus, it is possible to easily supply inert gas through the gas supply port.

According to a third aspect, the gas injection device further includes a biasing member provided between the barrel portion and the opener, and is arranged such that the opener fixed to the lower end of the elongate portion is configured to move the opening/closing mechanism upward against a biasing force of the biasing member.

In this gas injection device, the opener is biased downward by the biasing member, and this allows the lid portion of the opening/closing mechanism fixed to the opener to reliably close the gas supply port. Furthermore, when the opener is moved upward, at an earlier stage of the upward movement, the biasing member biases the barrel portion toward the lid portion and this reliably maintains the gas supply port closed by the lid portion.

According to a fourth aspect, the gas injection device is arranged such that the nozzle main body includes: a barrel portion forming the gas supply port; and an upper space provided in an upper portion of the barrel portion, the opening/closing mechanism includes: an elastic closing member provided in the upper space and configured to close the gas supply port; and a fixing portion fixing the elastic closing member to the barrel portion, and the opener is inert gas configured to open the closed gas supply port by elastically deforming the elastic closing member.

In this gas injection device, when inert gas having a pressure equal to or greater than a predetermined value is supplied, the inert gas pushes and elastically deforms the elastic closing member, thereby to open the closed gas supply port. Thus, it is possible to supply inert gas with a simple structure.

According to a fifth aspect, the gas injection device includes a discharge unit communicating with the gas passage and configured to discharge gas from the gas passage with the gas supply port closed.

In this gas injection device, the atmospheric air in the gas passage is dischargeable by the discharge unit before the upper end of the nozzle main body is brought into contact with the container to supply inert gas through the gas supply port. This prevents the atmospheric air in the gas passage from entering into the container when the inert gas is supplied to the container.

According to a sixth aspect, the gas injection device is arranged such that after the discharge unit discharges the gas and after an upper end of the nozzle main body is brought into contact with a container containing content, the opener causes the opening/closing mechanism to open the gas supply port closed by the opening/closing mechanism, and gas injection to the container is started.

In this gas injection device, after the atmospheric air in the gas passage is discharged by the discharge unit and after the upper end of the nozzle main body is brought into contact with the container, the gas supply port is opened to start the injection of inert gas into the container. This prevents the atmospheric air in the gas passage from entering into the container when starting the injection of inert gas into the container. Due to this, it is possible to prevent the change of the property of the wafers contained in the container.

According to a seventh aspect, the gas injection device is arranged such that after the injection of inert gas to the container is finished, the opening/closing mechanism closes the gas supply port.

In this gas injection device, after the injection of inert gas into the container is finished, the opening/closing mechanism closes the gas supply port. This makes it possible to prevent the leakage of inert gas from the gas supply port after the gas injection is finished.

Advantageous Effects of Invention

In the first aspect, the atmospheric air remaining in the gas passage is preventable from entering into a container to which inert gas is supplied, by opening the gas supply port closed by the opening/closing mechanism after the gas in the gas passage is discharged. Note that, the "atmospheric air" herein may include, but not limited to, oxygen, moisture, and particles that can change the property of wafers contained in the container (e.g., oxygen causes oxidation of wafers contained in the container). Because the entry of the atmospheric air into the container is prevented, it is possible to prevent the change of the property of the wafers contained in the container. Furthermore, the opener causes the open-ing/closing mechanism to open the closed gas supply port, and this allows inert gas to be easily supplied through the gas supply port.

In the second aspect, merely by moving the opener upward, the opening/closing mechanism also moves upward, so that the gas supply port closed by the lid portion is opened. Thus, it is possible to easily supply inert gas through the gas supply port.

In the third aspect, the opener is biased downward by the biasing member, and this allows the lid portion of the opening/closing mechanism fixed to the opener to reliably close the gas supply port. Furthermore, when the opener is moved upward, at an earlier stage of the upward movement, the biasing member biases the barrel portion toward the lid portion and this reliably maintains the gas supply port closed by the lid portion.

In the fourth aspect, when inert gas having a pressure equal to or greater than a predetermined value is supplied, the inert gas pushes and elastically deforms the elastic closing member, thereby to open the closed gas supply port. Thus, it is possible to supply inert gas with a simple structure.

In the fifth aspect, the atmospheric air in the gas passage is dischargeable by the discharge unit before the upper end of the nozzle main body is brought into contact with the container to supply inert gas through the gas supply port. This prevents the atmospheric air in the gas passage from entering into the container when the inert gas is supplied to the container.

In the sixth aspect, after the atmospheric air in the gas passage is discharged by the discharge unit and after the upper end of the nozzle main body is brought into contact with the container, the gas supply port is opened to start the injection of inert gas into the container. This prevents the atmospheric air in the gas passage from entering into the container when starting the injection of inert gas into the container. Due to this, it is possible to prevent the change of the property of the wafers contained in the container.

In the seventh aspect, after the injection of inert gas into the container is finished, the opening/closing mechanism closes the gas supply port. This makes it possible to prevent the leakage of inert gas from the gas supply port after the gas injection is finished.

BRIEF DESCRIPTION OF THE DRAWINGS

FIG. 15 is open.

DESCRIPTION OF EMBODIMENTS

The following describes an embodiment of the present invention with reference to the attached drawings.

Figure 1:
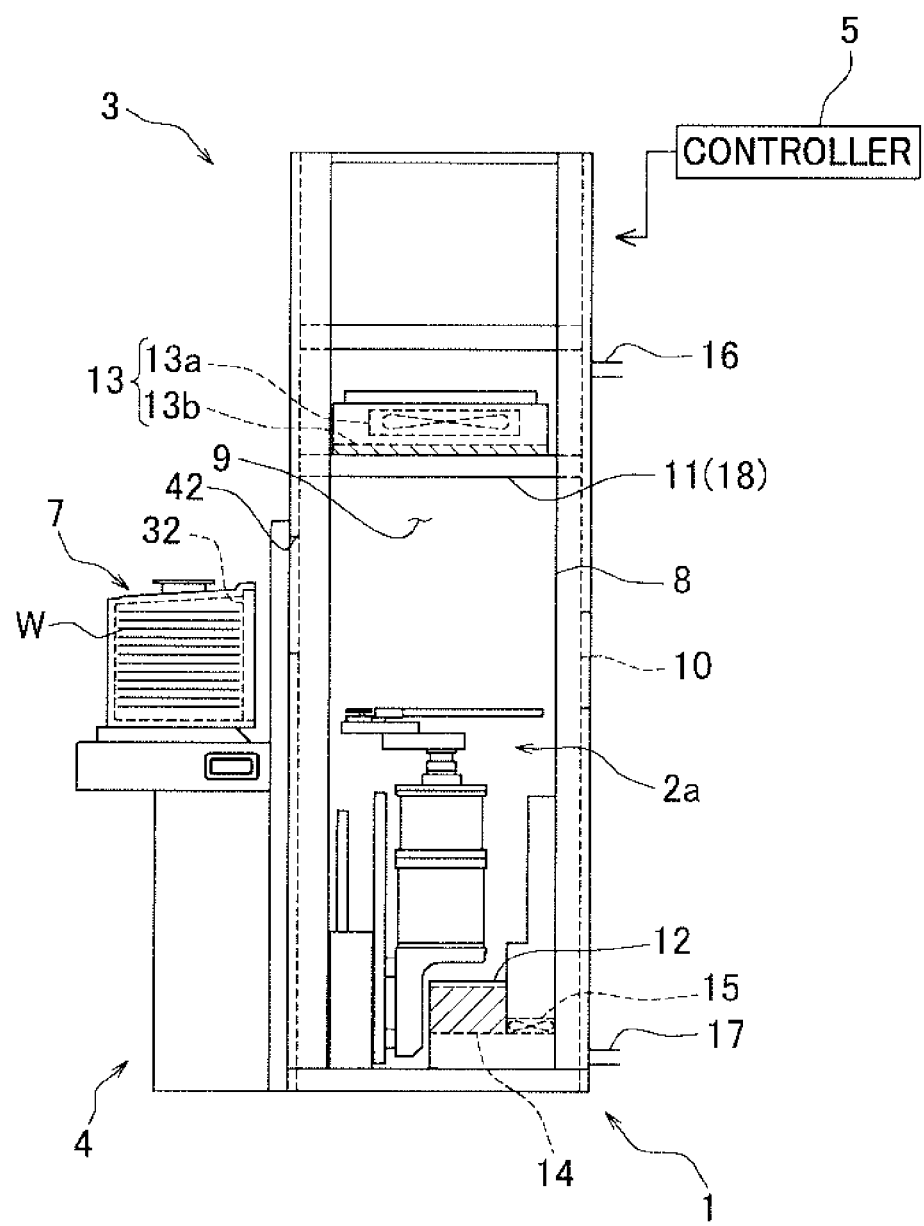
FIG. 1 is a side view illustrating a state in which a side wall of an EFEM has been detached.

FIG. 1 is a side view of an equipment front end module (EFEM) 1 from without a side wall so that its inside can be seen. As shown in FIG. 1, the EFEM 1 includes: a wafer conveyance apparatus 2 configured to convey one or more wafers W between predetermined transfer positions; a box-shaped casing 3 provided so as to surround the wafer conveyance apparatus 2; a load port 4 connected to an outer side of a front wall of the casing 3; and a controller 5. In this application, the side of the casing 3 to which the load port 4 is connected is a front side while the side opposite to the front side is a rear side. With respect to the casing 3, the direction toward the load port 4 is defined as a forward direction, and the direction opposite to the forward direction is defined as a rearward direction.

The controller 5 is configured to control operations of the wafer conveyance apparatus 2. This makes it possible to convey the wafers (contents) W, contained in a FOUP (container) 7 placed on the load port 4, into a conveyance space 9 in the casing 3, and to convey the wafers W back to the FOUP 7 after the wafers W are subjected to various processes.

Figure 2:
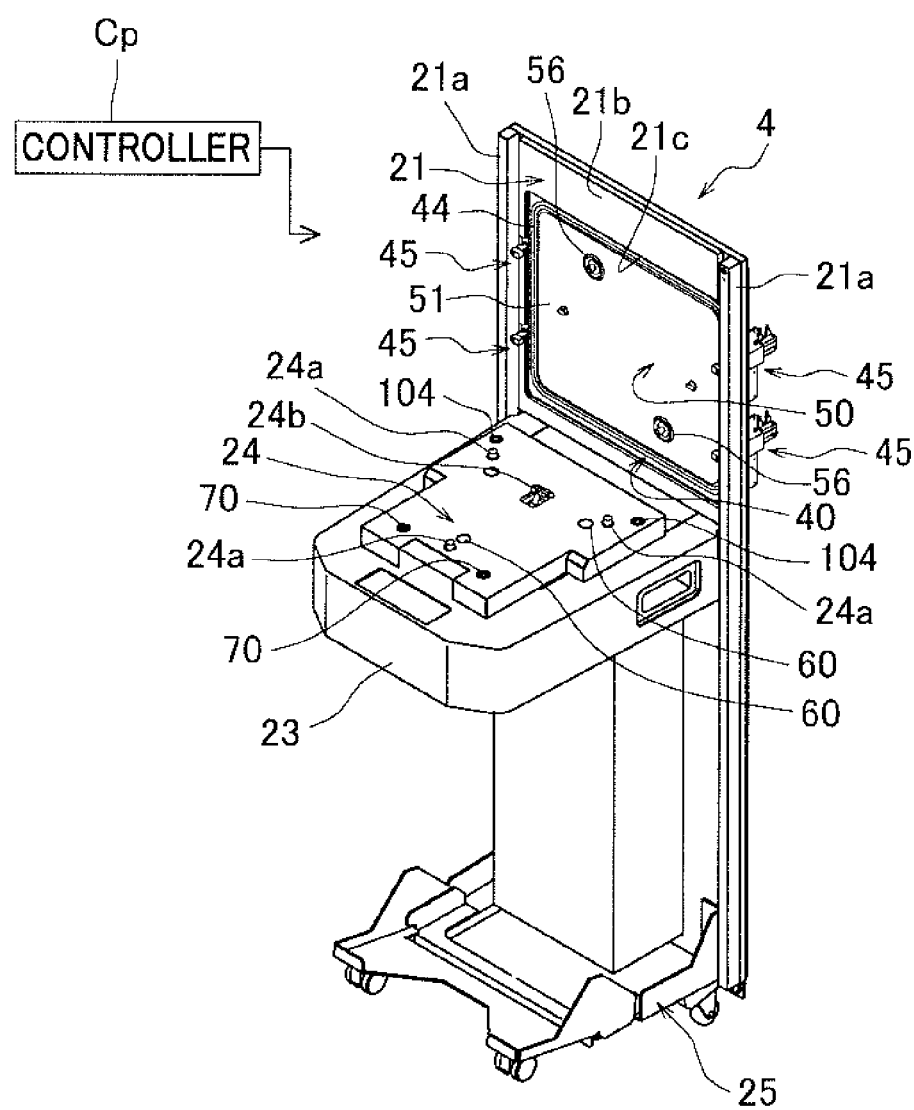
FIG. 2 is a perspective view of a load port shown in FIG. 1.

The load port 4 includes a door unit 51 (see FIG. 2). The door unit 51 is configured to be coupled to and move with a lid member 32 provided to the FOUP 7. This causes the FOUP 7 to be open to the conveyance space 9. In the FOUP 7, there are a number of carrier units arranged in a stacked manner in an up-down direction. This enables a number of wafers W to be contained in the FOUP 7. The FOUP 7 is generally filled with nitrogen. Under control of the controller 5, it is possible to replace the atmosphere in the FOUP 7 with nitrogen through the load port 4.

The controller 5 is embodied as a controller unit provided in an upper space in the casing 3. The controller 5 performs various controlling operations such as drive control of the wafer conveyance apparatus 2, nitrogen substitution control for the FOUP 7 by the load port 4, opening/closing control of the door unit 51, and nitrogen circulation control in the casing 3. The controller 5 is structured by a typical microprocessor or the like, which includes a central processing unit (CPU), a memory, and an interface. The memory has stored programs needed for processing. The CPU selects and executes a necessary program as needed, and is configured to perform a desired function in cooperation with its peripheral hard resources. The nitrogen circulation control will be described later.

The internal space of the casing 3 is partitioned by a partition member 8 into the conveyance space 9 and a gas return path 10. In the conveyance space 9, the wafer conveyance apparatus 2 operates. The conveyance space 9 and the gas return path 10 communicate with each other only through a gas delivery port 11 and a gas suction port 12. The gas delivery port 11 extends in a width direction and is provided in an upper portion of the conveyance space 9. The gas suction port 12 extends in the width direction and is provided in a lower portion of the conveyance space 9. The gas delivery port 11 and the gas suction port 12 are arranged so that a descending flow is generated in the conveyance space 9 and an ascending flow is generated in the gas return path 10, thereby to circulate inert gas. While in the present embodiment nitrogen is used as the inert gas, the inert gas to be circulated is not limited to nitrogen gas, and gas other than nitrogen may be used.

A gas supplier 16 configured to supply nitrogen into the casing 3 is connected to a rear-side upper portion of the gas return path 10. The gas supplier 16 is able to start/stop supplying nitrogen based on an instruction from the controller 5. Because of this, if some amount of nitrogen flows out of the casing 3, the gas supplier 16 can supply the corresponding amount of nitrogen. This makes it possible to maintain the nitrogen atmosphere in the casing 3 constant. Meanwhile, a gas discharger 17 configured to discharge nitrogen gas from the casing 3 is connected to a rear-side lower portion of the gas return path 10. The gas discharger 17 operates based on an instruction from the controller 5. The gas discharger 17 is able to establish communication between the inside of the casing 3 and a nitrogen gas discharge place provided outside, by opening a not-shown shutter. The combination of the function of discharging the nitrogen gas and the above-mentioned function of supplying the nitrogen gas by the gas supplier 16 enables the replacement of the atmosphere in the casing 3 with nitrogen and the control of the pressure in the casing 3. In the present embodiment, the gas supplier 16 is configured to supply nitrogen because the gas to be circulated is nitrogen gas. In cases where gas other than nitrogen is circulated, the gas supplier 16 supplies the circulated gas.

At the gas delivery port 11, a fan-filter unit 13 (FFU 13) is provided. The fan-filter unit 13 includes: a fan 13a functioning as a first blower; and a filter 13b. The fan-filter unit 13 is configured to remove particles contained in the nitrogen gas circulating in the casing 3, and to blow wind downward to the conveyance space 9, thereby to generate the descending flow in the conveyance space 9. The FFU 13 is supported by a support member 18 connected to the partition member 8 and extending in a horizontal direction.

The above-mentioned fan 13a of the FFU 13 and a fan 15 cause the nitrogen gas in the casing 3 to descend in the conveyance space 9 and to ascend in the gas return path 10, with the result that the gas circulates in the casing 3. The gas delivery port 11 opens downward. Because of this, nitrogen gas is sent downward by the FFU 13. The gas suction port 12 opens upward. This enables the nitrogen gas to be sucked downward without disturbing the descending flow generated by the FFU 13. These arrangements create a smooth flow of nitrogen gas. The descending flow in the conveyance space 9 removes particles attached to upper portions of the wafers W and gas temporarily discharged from the processed wafers W. Furthermore, the descending flow prevents the discharged gas and the particles from floating as a result of movement of devices in the conveyance space 9, such as the wafer conveyance apparatus 2.

FIG. 2 shows a perspective view of the load port 4. The following describes the structure of the load port 4.

The load port 4 includes: a bottom portion 25 to which casters and installation legs are attached; a base 21 provided upright from a rear side of the bottom portion 25; and a horizontal base portion 23 provided so as to extend forward from a portion of the base 21 that is at about 60% level of the height of the base 21. A table 24 on which the FOUP 7 is to be placed is provided on an upper portion of the horizontal base portion 23.

Figure 3:
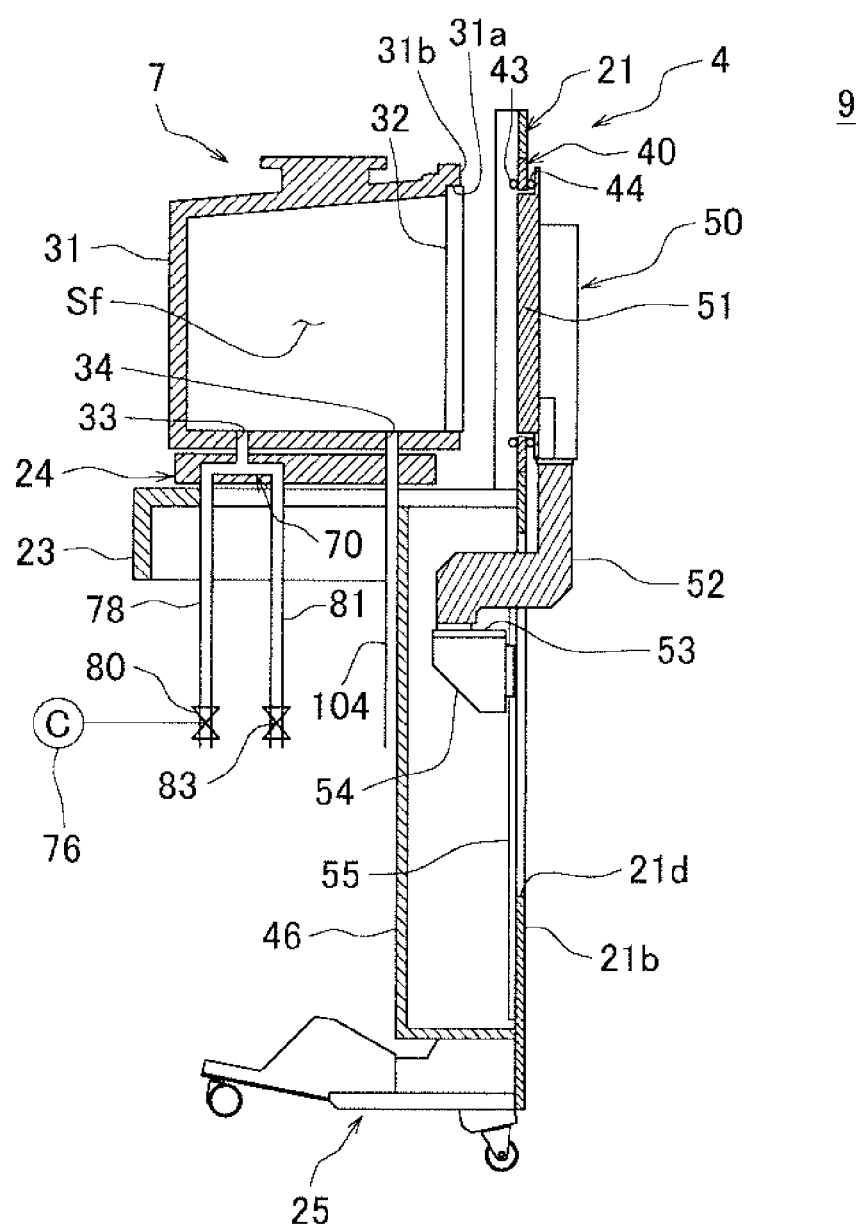
FIG. 3 shows a profile of a FOUP and the load port.

As schematically shown in FIG. 3, the FOUP 7 includes: a main body 31 including an internal space Sf configured to contain the wafers W (see FIG. 1); and a lid member 32 configured to cover/uncover an opening 31a. The opening 31a is provided at one side of the main body 31 so as to function as an opening through which the wafers W are transferred to/from the FOUP 7. When the FOUP 7 is properly placed on the table 24, the lid member 32 is opposed to the base 21.

Returning back to FIG. 2, positioning pins 24a and a lock protrusion 24b are provided on the table 24. The positioning pins 24a are used for positioning the FOUP 7. The lock protrusion 24b is configured to secure the FOUP 7 onto the table 24. After the FOUP 7 is properly positioned on the table 24, the lock protrusion 24b is controlled so as to perform locking operation, to secure the FOUP 7. Meanwhile, unlocking operation makes the locked FOUP 7 releasable from the table 24. The table 24 is movable in a front-rear direction by a table driving unit (not shown), with the FOUP 7 placed thereon. Now, "to be properly placed" herein means that the level of the bottom surface of the FOUP 7 with respect to the table 24 is within a predetermined range from the top surface of the table 24.

Figure 5:
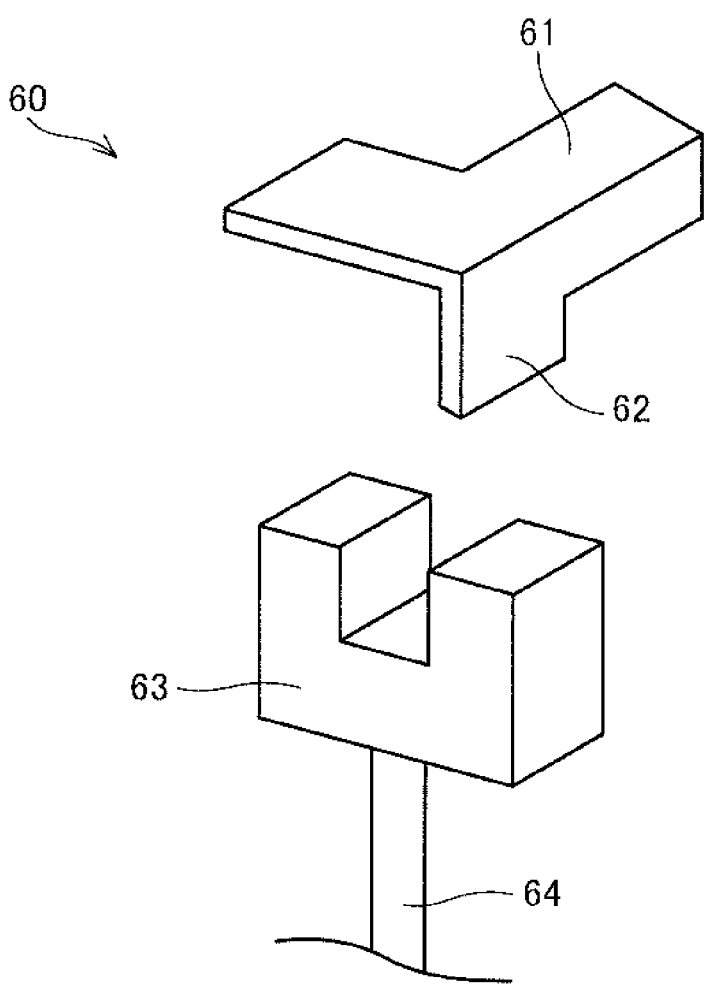
FIG. 5 is an enlarged perspective view of a part of a positioning sensor.

Whether the FOUP 7 has been properly positioned or not is detected by positioning sensors 60 (see FIG. 5) provided near the respective positioning pins 24a. Each positioning sensor 60 includes: a sensor 61 formed by a leaf spring; a flag 62 protruding downward from the sensor 61; a transmission photosensor 63 provided below the flag 62; and a sensor cable 64 connected to the photosensor 63. It is preferable that the positioning sensors 60 are provided near the respective positioning pins 24a.

Upon the placement of the FOUP 7 on the table 24, the positioning pins 24a are respectively inserted into positioning grooves (not shown) of the FOUP 7, and a bottom portion of the FOUP 7 comes into contact with the sensors 61. As a result, the weight of the FOUP 7 lowers the flags 62 and shades the photosensors 63. Thus, the placement of the FOUP 7 is recognized or detected. Such a detection result is transmitted to a controller via the sensor cables 64. Thus, the proper positioning of the FOUP 7 on the table 24 is detectable based on whether the flags 62 shade the respective photosensors 63. Specifically, in order to detect whether the FOUP 7 has been properly positioned, it is only required to design the positioning sensors so that the flags 62 shade their respective photosensors 63 when the FOUP 7 is properly positioned. Alternatively, the positioning sensors may be configured to detect the proper positioning based on the comparison between: the amount of light shaded by the flags 62, which is detected by the photosensors 63; and a predetermined threshold.

In the table 24, two gas injection devices 70 and two second discharge nozzles 104 are provided. Each gas injection device 70 is configured to inject nitrogen gas into the FOUP 7. Each second discharge nozzle 104 is configured to discharge nitrogen gas from the FOUP 7. The gas injection devices 70 and the second discharge nozzles 104 are generally positioned below the bottom surface of the properly positioned FOUP 7, and in use, they are raised upward to be connected to gas supply valves 33 (see FIG. 3) and gas discharge valves 34 of the FOUP 7, respectively.

In use, upper ends of the gas injection devices 70 are brought into contact with the gas supply valves 33 of the FOUP 7, and similarly, upper ends of the second discharge nozzles 104 are brought into contact with the gas discharge valves 34 of the FOUP 7. Gas such as dry nitrogen gas is supplied to the internal space Sf of the FOUP 7 by the gas injection devices 70 through the gas supply valves 33, and nitrogen gas in the internal space Sf is able to be discharged by the second discharge nozzles 104 through the gas discharge valves 34. By setting the nitrogen gas supply amount so as to be larger than the nitrogen gas discharge amount, the pressure in the internal space Sf can be a positive pressure higher than the outside pressure or the pressure in the conveyance space 9 of the casing 3.

When each gas supply valve 33 of the FOUP 7 placed on the load port 4 is an elastic member called "grommet-type" member, the upper end of the corresponding gas injection device 70 is generally made of material having higher stiffness than that of the gas supply valve 33 (e.g., metal and plastic), or is made of elastic material similar to that of the grommet-type member. In the present embodiment, the upper end of each gas injection device 70 is made of plastic.

The base 21 constituting the load port 4 functions as a part of a front wall which separates the conveyance space 9 from the external space. As shown in FIG. 2, the base 21 includes: support poles 21a, 21a provided so as to extend upright at the both sides; a base main body 21b supported by the support poles 21a, 21a; and a window unit 40 attached to a window part 21c which is a substantially rectangular opening in the base main body 21b. In the present application, "substantially rectangular" means a shape based on a rectangle having four sides with its four corners rounded off so that the four sides are smoothly connected by arcs.

Figure 4:
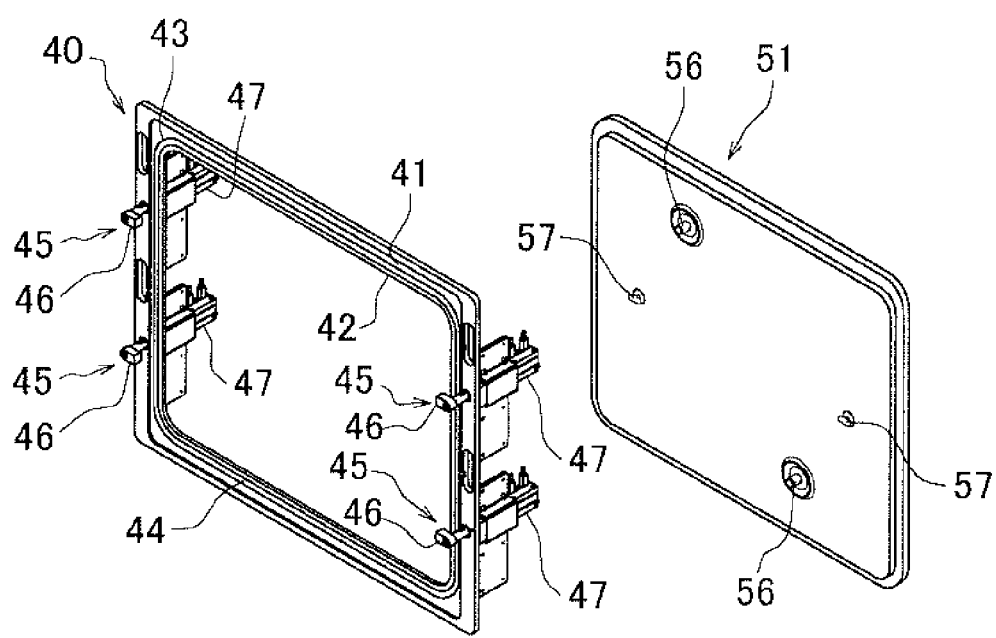
FIG. 4 is an enlarged perspective view of a main part including a window unit and a door unit constituting the EFEM.

The window unit 40 is provided so as to be opposed to the above-mentioned lid member 32 (see FIG. 3) of the FOUP 7. As will be described later, the window unit 40 has a substantially rectangular opening 42 (see FIG. 4). Through this opening 42, the conveyance space 9 of the casing 3 is communicable to its outside.

The window unit 40 includes: a window frame portion 41; a first O-ring 43 and a second O-ring 44 attached to the window frame portion 41 and functioning as elastic members; and clamp units 45 each functioning as a clamp configured to bring the FOUP 7 into close contact with the window frame portion 41 via the first O-ring 43.

The window frame portion 41 has a shape of a frame in which the substantially rectangular opening 42 is formed. The window frame portion 41 forms a part of the above-described base 21 (see FIG. 2) as an element of the window unit 40. Because of this, it can be said that the opening 42 functions as an opening in the front wall of the casing 3. The first O-ring 43 is provided on a front surface of the window frame portion 41 so as to surround the opening 42 in the vicinity of the perimeter of the opening 42. The second O-ring 44 is provided on a rear surface of the window frame portion 41 so as to surround the opening 42 in the vicinity of the perimeter of the opening 42.

The opening 42 is slightly larger than the outer circumference of the lid member 32 of the FOUP 7, and this allows the lid member 32 to move through the opening 42. In the state where the FOUP 7 is placed on the table 24, a portion of a front surface of the main body 31 that surrounds the lid member 32 functions as a contact surface 31b, and the contact surface 31b contacts the front surface of the window frame portion 41 via the first O-ring 43. Thus, the first O-ring 43 creates a seal, or eliminates a gap, between the perimeter of the opening 42 (base 21) and the FOUP 7 while the FOUP 7 is attached to the window unit 40.

The above-mentioned door unit 51 is configured to be in contact with the rear surface of the window frame portion 41 via the second O-ring 44. Thus, the second O-ring 44 creates a seal between the perimeter of the opening 42 and the door unit 51.

The clamp units 45, the total number of which is four, are provided at both side portions of the window frame portion 41. In each side portion, the clamp units are apart from each other in the up-down direction. Each clamp unit 45 is formed mainly by an engagement leaf 46 and a cylinder 47 configured to actuate the engagement leaf 46. The clamp units 45 are configured to push, toward the base 21, the FOUP 7 attached to the window unit 40.

In a forward protruding position, the leading end of the engagement leaf 46 is directed upward. In a rearward retracted position, the leading end of the engagement leaf 46 is directed to inward, toward the FOUP 7. Because the leading ends of the engagement leaves 46 are directed inward through the clamping operation, the engagement leaves 46 are engaged with a flange portion protruding laterally from the FOUP 7.

The load port 4 further includes an opening/closing mechanism 50 configured to open/close the window unit 40 to which the FOUP 7 is attachable.

As shown in FIG. 3, the opening/closing mechanism 50 includes: a door unit 51 configured to cover/uncover the opening 42; a support frame 52 supporting the door 51; a movable block 54 supporting the support frame 52 so that the support frame 52 is movable in the front-rear direction via a sliding supporter 53; and a sliding rail 55 supporting the movable block 54 so as to be movable in the up-down direction with respect to the base main body 21b.

Furthermore, actuators (not illustrated) configured to move the door unit 51 in the front-rear direction and in the up-down direction are provided respectively for these directions. Upon receiving a drive instruction from a controlling unit Cp, the actuators move the door unit 51 in a designated direction of these directions. The load port 4 is configured to operate under the control of the controlling unit Cp configured to give drive instructions to the components of the load port 4.

The door unit 51 includes: a sucker 56 (see FIG. 4) configured to suck and adhere to the lid member 32 of the FOUP 7; and connecting units 57 for latching operation to open/close the lid member 32 of the FOUP 7 and for holding the lid member 32. The door unit 51 is configured to secure/release the lid member 32. This enables the attachment/detachment of the lid member 32 with respect to the FOUP 7. The unlatch operation to the lid member 32 using the connecting units 57 makes the lid member 32 openable, and makes the lid member 32 and the door unit 51 connected together. Meanwhile, the thus connected lid member 32 is separable from the door unit 51, and attachable to the main body 31, to close the FOUP 7.

Now, each gas injection device 70 of the embodiment of the present invention will be described with reference to FIG. 6. The gas injection device 70 includes: a nozzle main body 71 having a gas supply port 72 through which inert gas is supplied to the FOUP 7; an opening/closing mechanism 92 configured to seal or close the gas supply port 72; and an opener 96 configured to cause the opening/closing mechanism 92 sealing the gas supply port 72 to open the gas supply port 72.

The nozzle main body 71 includes: a barrel portion 73 forming the gas supply port 72; a first peripheral wall 74 protruding upward from an outer circumferential edge of an upper end surface of the barrel portion 73; and a second peripheral wall 75 protruding downward from an outer circumferential edge of a lower end surface of the barrel portion 73.

The barrel portion 73 has a cylindrical prism shape extending along an axial direction of the nozzle main body 71. The barrel portion 73 includes: a gas passage 77 communicating with the gas supply port 72; a first sealing portion 85 provided at an upper edge portion around the gas supply port 72; and an annular engagement portion 86 protruding radially outward from an outer circumferential surface of the barrel portion 73.

The gas passage 77 extends through the barrel portion 73 linearly in a horizontal direction orthogonal to the axial direction of the nozzle main body 71. A central portion of the gas passage 77 communicates with the gas supply port 72. One of openings of the gas passage 77 is connected to a supply nozzle 78, to form a supply passage 79. The supply nozzle 78 is connected to a not-shown nitrogen supply source via a supply valve 80 (see FIG. 3), and is configured to supply nitrogen gas to the FOUP 7. Another opening of the gas passage 77 is connected to a first discharge nozzle 81 functioning as a discharge unit, to form a discharge passage 82. The first discharge nozzle 81 is connected to a not-shown vacuum pump via a discharge valve 83, and is configured to discharge the atmospheric air in the gas passage 77 with the gas supply port 72 sealed or closed.

An upper space 87, which is above the barrel portion 73, is created between the first peripheral wall 74 and the upper end surface of the barrel portion 73. A protruding wall 88 protruding toward the FOUP 7 is provided at a leading end portion of the first peripheral wall 74.

A lower space 89, which is below the barrel portion 73, is created between the second peripheral wall 75 and the lower end surface of the barrel portion 73. A lower end of the second peripheral wall 75 is supported by a seat 90 fixed to the table 24. While in the present embodiment, the second peripheral wall 75 is provided, one or more pins protruding downward from the outer circumferential edge of the lower end surface of the barrel portion 73 may be provided instead of the second peripheral wall 75.

The opening/closing mechanism 92 has a T-shape cross section, and includes: a disc-shaped lid portion 93; and an elongate portion 94 of a cylindrical prism shape extending downward from a central portion of a lower surface of the lid portion 93. The lid portion 93 is in the upper space 87. An outer circumferential edge portion of the lower surface of the lid portion 93 is configured to be in contact with the first sealing portion 85, to create a seal at the perimeter of the gas supply port 72. The elongate portion 94 extends from the lid portion 93 to the lower space 89 through the barrel portion 73. A second sealing portion 95 provided at a lower end portion of the barrel portion 73 creates a seal between the elongate portion 94 and the barrel portion 73.

The opener 96 is connected to a lower end of the elongate portion 94, and is configured to push the elongate portion 94 upward to move the opening/closing mechanism 92 upward. The opener 96 includes: a disc-like support member (support portion) 97; and an annular upright wall 98 protruding upward from an upper surface of the support member 97. Inside the upright wall 98 of the support member 97, there is a through hole 99 passing through the support member 97 in its thickness direction. The second peripheral wall 75 is inserted into the through hole 99. Due to this, the opener 96 is provided in and around the lower space 89 so as to be movable in the up-down direction relative to the barrel portion 73.

A radially-outside portion of the support member 97 is connected to lower ends of air cylinders 101 provided in the table 24. Due to this, as the air cylinders 101 drive the support member 97 up and down, the nozzle main body 71 is raised and lowered via springs 102.

The springs 102 functioning as biasing members are provided between the barrel portion 73 and the support member 97. The opener 96 pushes the opening/closing mechanism 92 upward against the elastic force of the springs 102. The opener 96 and the opening/closing mechanism 92 are formed unitarily.

Figure 10:
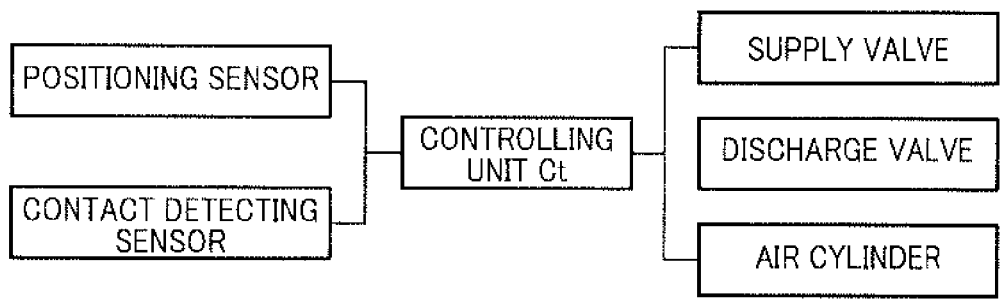
FIG. 10 is a block diagram illustrating how a controlling unit is connected.

As shown in FIG. 10, an input end of a controlling unit Ct is connected to: the positioning sensors 60 configured to detect whether the FOUP 7 has been properly placed; and a contact detecting sensor configured to detect whether the nozzle main body 71 has contacted the FOUP 7. An output end of the controlling unit Ct is connected to the supply valve 80, the discharge valve 83; and the air cylinders 101. The controlling unit Ct is provided in the EFEM 1, and incorporates therein various memories and a controller configured to receive input for operation given by a user.

The following describes an example of operation of each gas injection device 70 of the present embodiment, with reference to FIG. 6 to FIG. 11.

Figure 6:
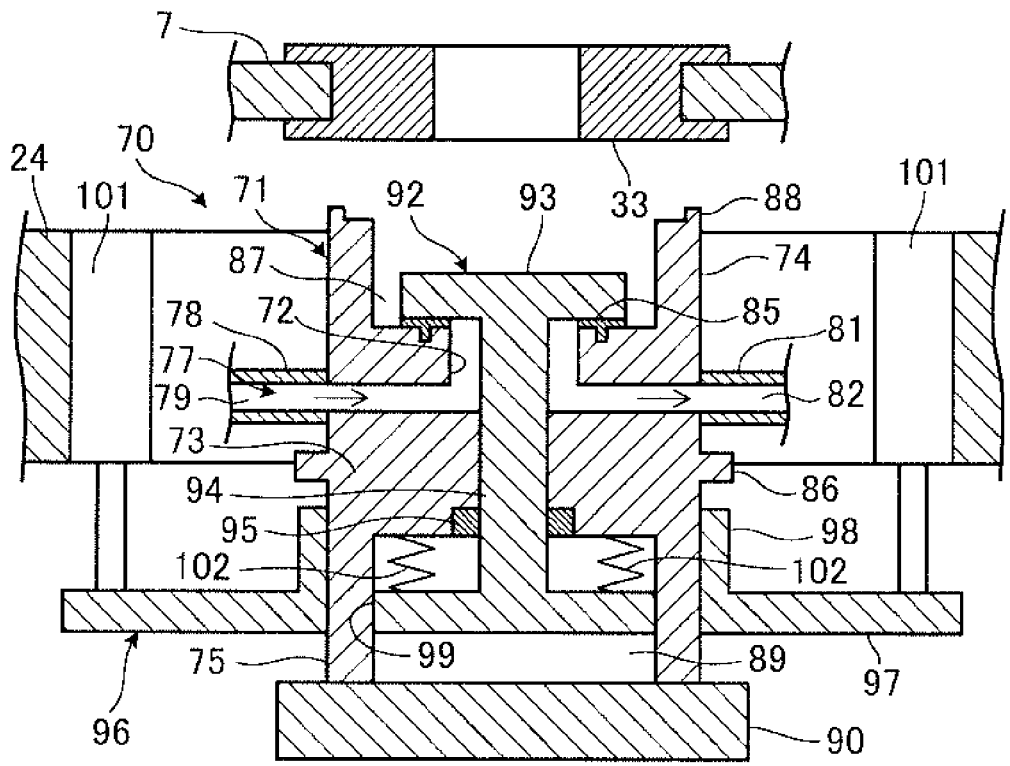
FIG. 6 is a cross section of a gas injection device of an embodiment.
Figure 11:
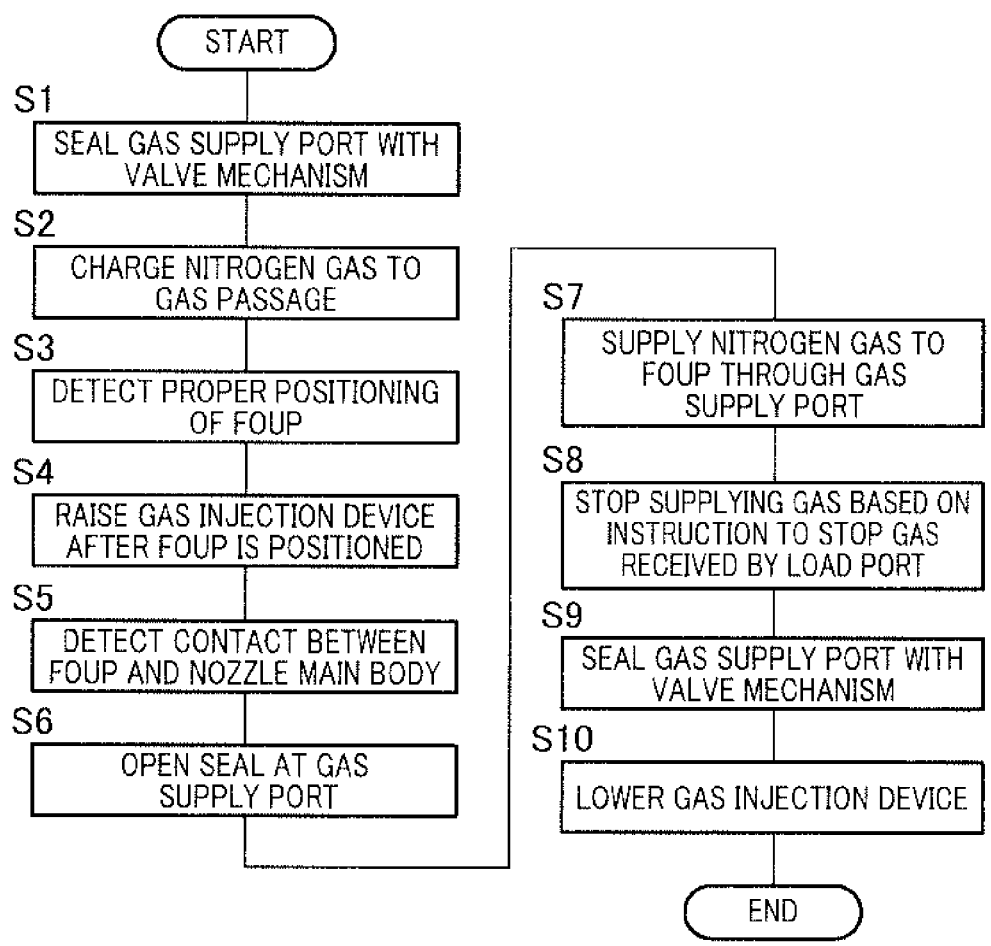
FIG. 11 is a flowchart illustrating gas injection operation into the FOUP.

As shown in FIG. 11, in step S1, the opening/closing mechanism 92 seals or closes the gas supply port 72 (see FIG. 6). In this step, the supply valve 80 and the discharge valve 83 are closed.

In step S2, the supply valve 80 and the discharge valve 83 are opened, and the atmospheric air in the gas passage 77 is replaced by nitrogen. After the replacement by the nitrogen is finished, the supply valve 80 and the discharge valve 83 are closed. Note that, step S2 may be altered as follows: the discharge valve 83 is opened with the supply valve 80 kept closed, so as to merely establish a vacuum state by discharging the atmospheric air from the gas passage 77. Alternatively, the supply valve 80 may be opened after the vacuum state is created, so that the gas passage 77 is filled with nitrogen gas. In the process of replacing the atmospheric air in the gas passage 77 by nitrogen gas, the charge of nitrogen gas through the supply valve 80 and the discharge of the air through the discharge valve 83 may be alternately performed. This further facilitates the discharge of atmospheric air from the gas passage 77.

In step S3, the positioning sensors 60 detect that the FOUP 7 has been properly positioned on the table 24, and then the processing proceeds to step S4.

Figure 7:
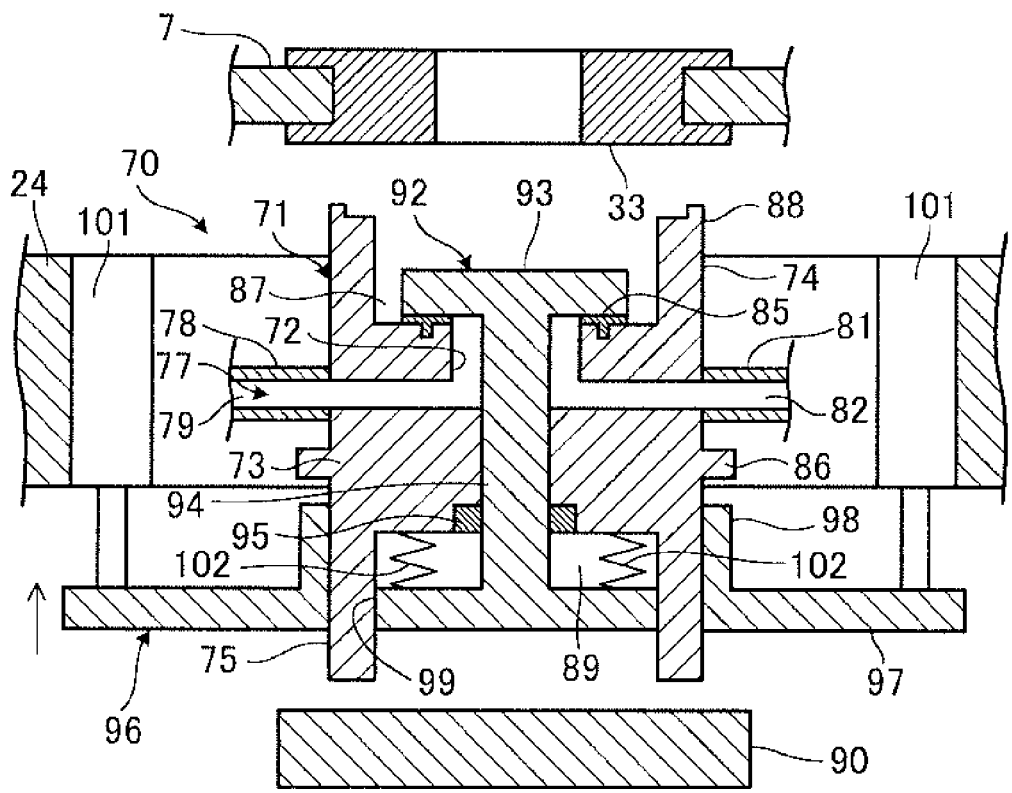
FIG. 7 is a cross section of the gas injection device of FIG. 6, which is moved toward the FOUP.
Figure 8:
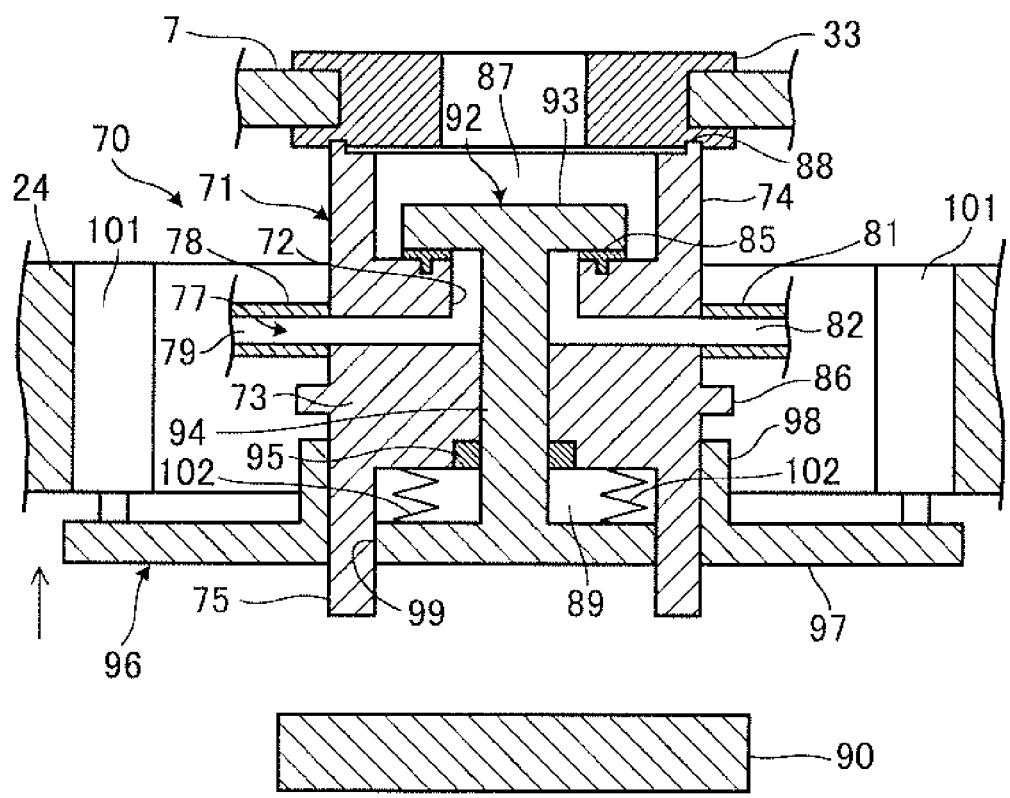
FIG. 8 is a cross section of the gas injection device of FIG. 6, which is further moved toward the FOUP.

After the FOUP 7 is positioned on the table 24, in step S4, the air cylinders 101 raise the gas injection device 70 toward the FOUP 7 via the support member 97 (see FIG. 7). At this time, because the springs 102 bias the lower end surface of the barrel portion 73 upward with a force larger than the force of gravity to the barrel portion 73, the first seal member 85 is pushed toward the lid portion 93. Therefore, the seal by the opening/closing mechanism 92 at the gas supply port 72 is maintained. Meanwhile, the lower end of the second peripheral wall 75 is separated from the seat 90.

In step S5, the contact between the FOUP 7 and the protruding wall 88 of the nozzle main body 71 is detected by the contact detecting sensor. In cases where the contact detecting sensor is not used, a raised position of the nozzle main body 71, to which it should be raised, may be set in advance with reference to the bottom surface of the FOUP 7 properly positioned on the table 24. This enables indirect detection of the contact between the FOUP 7 and the protruding wall 88 of the nozzle main body 71 by detecting the amount of stroke of the air cylinders 101 or the pressure of the air cylinders 101.

Figure 9:
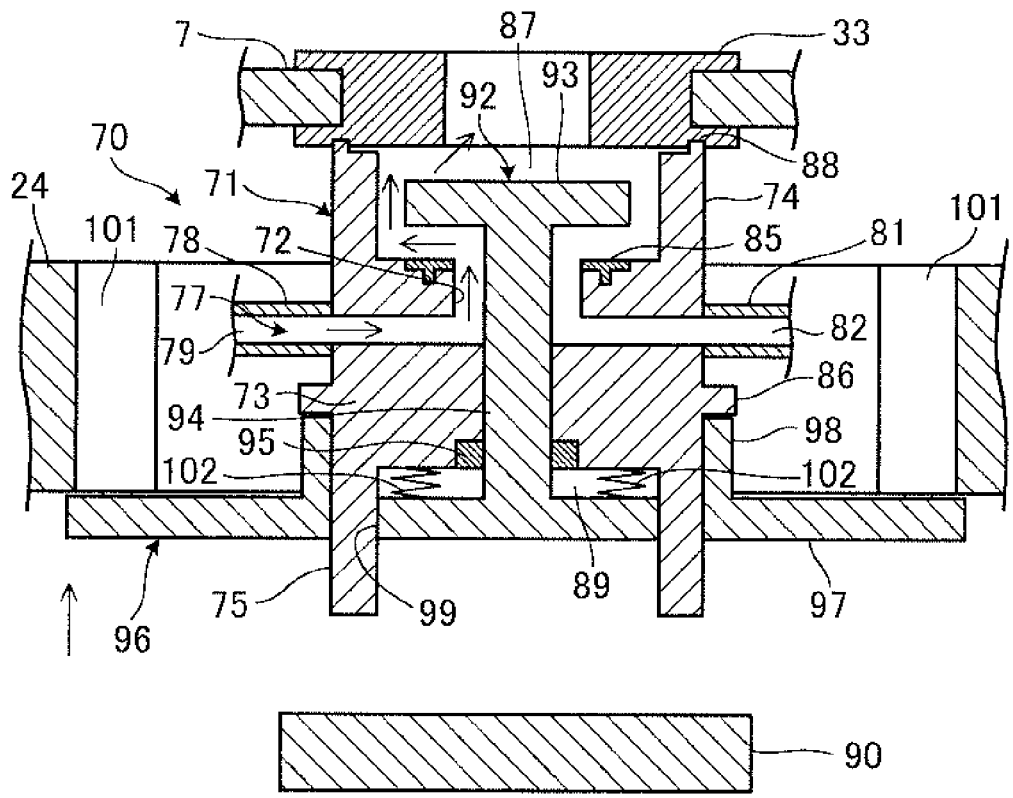
FIG. 9 is a cross section of the gas injection device of FIG. 6, which is attached to the FOUP.

As the air cylinders 101 further move the support member 97 upward against the biasing force of the springs 102, the opening/closing mechanism 92 moves upward. At this time, the nozzle main body 71 cannot move it contacts the gas supply valve 33 of the FOUP 7, and therefore the springs 102 are compressed, and as shown in FIG. 9, the seal by the opening/closing mechanism 92 at the gas supply port 72 is opened (step 6). The ascent of the opening/closing mechanism 92 is stopped as an upper end of the upright wall 98 is received by the engagement portion 86.

In subsequent step S7, the supply valve 80 is opened, and then nitrogen gas ejected from the nitrogen gas supply source flows through the supply nozzle 78, the supply passage 79, the gas supply port 72, and the upper space 87, in order, to be supplied to the FOUP 7. Consequently, the FOUP 7 is filled with nitrogen gas.

In step S8, when the load port 4 receives a command to stop supplying nitrogen gas, the supply valve 80 is closed, to stop the supply of nitrogen gas to the FOUP 7. Subsequently, in step S9, the opening/closing mechanism 92 seals or closes the gas supply port 72. Specifically, as the support member 97 is moved downward by the air cylinders 101, the opening/closing mechanism 92 is also moved downward, to seal or close the gas supply port 72 (see FIG. 8).

In step S10, as the support member 97 is moved further downward, the gas injection device 70 is moved downward to be separated from the FOUP 7 (see FIG. 7). In this state, the springs 102 try to re-expand, the nozzle main body 71 is biased toward the lid portion 93 relative to the support member 97, and therefore the gas supply port 72 is kept sealed. Upon contact of the lower end of the second peripheral wall 75 with the seat 90, the descent of the gas injection device 70 is finished (see FIG. 6).

[Characteristics of Gas Injection Device of the Present Embodiment]

Each gas injection device 70 of the present embodiment has the following characteristics.

In the gas injection device 70 of the present embodiment, after the air in the gas passage 77 is discharged, the gas supply port 72 sealed or closed by the opening/closing mechanism 92 is opened. This prevents the atmospheric air in the gas passage 77 from entering into the FOUP 7, to which nitrogen gas is supplied, and thereby prevents change of the property of the wafers contained in the FOUP 7. Furthermore, the opener 96 causes the opening/closing mechanism 92 to open the sealed or closed gas supply port 72, and this allows nitrogen gas to be easily supplied through the gas supply port 72.

In the gas injection device 70 of the present embodiment, merely by moving the opener 96 upward, the opening/closing mechanism 92 also moves upward, so that the gas supply port 72 sealed or closed by the lid portion 93 is opened. Thus, it is possible to easily supply nitrogen gas through the gas supply port 72.

In the gas injection device 70 of the present embodiment, the opener 96 is biased by the springs 102 downward relative to the nozzle main body 71. This allows the lid portion 93 of the opening/closing mechanism 92 connected to the opener 96 to reliably seal or close the gas supply port 72. When the opener 96 is moved upward, at an earlier stage of the upward movement, the springs 102 bias the barrel portion 73 toward the lid portion 93 and this reliably maintains the gas supply port 72 sealed or closed by the lid portion 93.

In the gas injection device 70 of the present embodiment, the atmospheric air in the gas passage 77 is dischargeable by the first discharge nozzle 81 before the upper end of the nozzle main body 71 is brought into contact with the FOUP 7 to supply nitrogen gas through the gas supply port 72. This prevents the atmospheric air in the gas passage 77 from entering into the FOUP 7 when nitrogen gas is supplied to the FOUP 7.

In the gas injection device 70 of the present embodiment, after the atmospheric air in the gas passage 77 is discharged by the first discharge nozzle 81 and after the upper end of the nozzle main body 71 is brought into contact with the FOUP 7, the gas supply port 72 is opened to start the injection of gas into the FOUP 7. This prevents the atmospheric air in the gas passage 77 from entering into the FOUP 7 when starting the injection of nitrogen gas into the FOUP 7. Due to this, it is possible to prevent the change of the property of the wafers contained in the FOUP 7. It is preferable to discharge the atmospheric air in the upper space 87 by moving the opener 96 upward while discharging the gas in the nozzle when the gas supply port 72 is opened after the upper end of the nozzle main body 71 is brought into contact with the FOUP 7. Furthermore, it is preferable to inject nitrogen gas into the FOUP 7 after the atmospheric air in the upper space 87 is discharged as above. This prevents the atmospheric air in the upper space 87 from entering into the FOUP 7.

In the gas injection device 70 of the present embodiment, after the injection of nitrogen gas into the FOUP 7 is finished, the opening/closing mechanism 92 seals or closes the gas supply port 72. Then, the nozzle main body 71 is separated from the FOUP 7. This makes it possible to prevent the leakage of nitrogen gas from the gas supply port 72 after the injection of nitrogen gas is finished. Alternatively, after the injection of nitrogen gas into the FOUP 7 is finished, the pressure in the nozzle main body 71 may be maintained positive so as to be equal to or less than a predetermined value. After the nozzle main body 71 in this state is separated from the FOUP 7, or simultaneously with the separation, the gas supply port 72 may be closed or sealed by the opening/closing mechanism 92. Note that the "predetermined value" herein means a pressure value which does not open an on-off valve (not illustrated) such as a check valve provided at the gas supply port 72. Such an on-off valve is configured to seal or close the gas supply port 72 in an off state, to prevent the gas in the FOUP 7 from flowing to the outside of the FOUP 7, and also to prevent the atmospheric air outside the FOUP 7 from entering into the FOUP 7. The on-off valve is configured to open under a predetermined pressure or more, to allow nitrogen gas to flow into the FOUP 7 through the gas supply port 72.

While an embodiment of the present invention has been described with reference to the figures, the specific structure of the invention is not limited to the described embodiment, and it is evident that many alternatives, modifications and variations will be apparent to those skilled in the art. The scope of the present invention is defined not by the above embodiment but by claims set forth below, and shall encompass the equivalents in the meaning of the claims and every modification within the scope of the claims.

Figure 12:
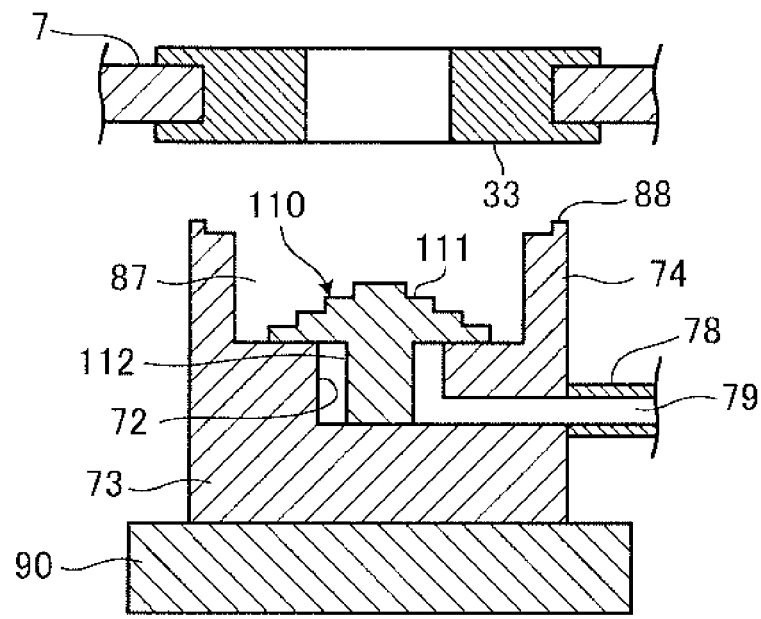
FIG. 12 is a cross section of a gas injection device of a variant embodiment.

In the above-described embodiment, the seal at the gas supply port 72 is created and opened by moving the opening/closing mechanism 92 in the up-down direction. However, this arrangement is not essential, and an opening/closing mechanism 110 as shown in FIG. 12 may be adopted. The opening/closing mechanism 110 includes: an elastic closing member 111 positioned in the upper space 87 and configured to cover the perimeter of the gas supply port 72 with an outer circumferential edge portion of a lower surface of the elastic closing member 111; and a fixing portion 112 fixing the elastic closing member 111 to the barrel portion 73. Note that in the following description of variant embodiments, the elements same as those in the above-described embodiment are given the same reference numerals, and the description of such elements is not repeated.

Figure 13:
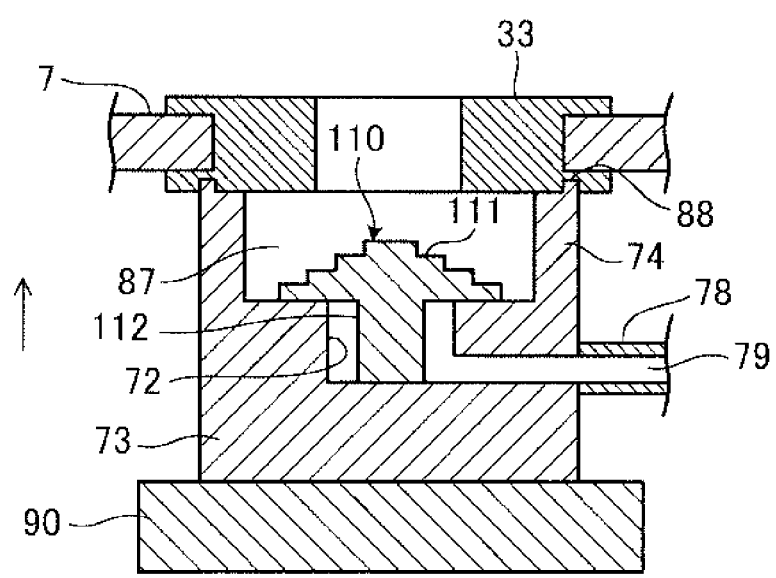
FIG. 13 is a cross section of the gas injection device with an elastic closing member according to the variant embodiment of FIG. 12, which is attached to the FOUP.
Figure 14:
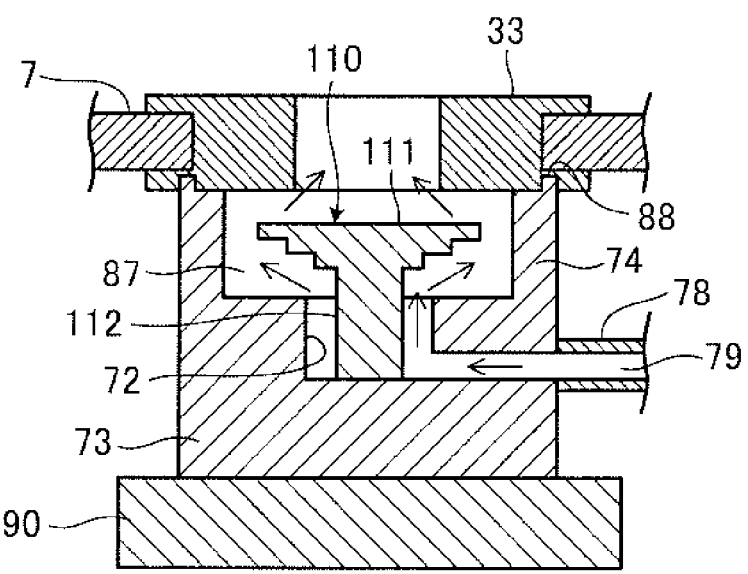
FIG. 14 is a cross section of the gas injection device according to the variant embodiment of FIG. 12, which is attached to the FOUP and which injects inert gas.

The opening/closing mechanism 110 is arranged as follows. A not-shown air cylinder moves the barrel portion 73 upward (see FIG. 13), and causes the protruding wall 88 to be fitted in a recess 36 of the FOUP 7. As nitrogen gas is supplied to flow from the supply nozzle 78 to the upper space 87 in this state, as shown in FIG. 14, the pressure of the nitrogen gas elastically deforms the elastic closing member 111, with the result that the seal at the gas supply port 72 is opened. As described above, the nitrogen gas with a predetermined pressure or higher pushes and elastically deforms the elastic closing member 111, to open the seal at the gas supply port 72. The "predetermined pressure" herein means a pressure value which can elastically deform the elastic closing member 111 to open the gas supply port 72 sealed or closed by the check valve. Thus, it is possible to supply nitrogen gas to the FOUP 7 from the supply passage 79 through the upper space 87, with a simple structure. In this arrangement, the discharge passage 82 in the above-described embodiment does not have to be provided. For example, before the nozzle main body 71 is separated from the FOUP 7, the supply of nitrogen gas is stopped and the gas supply port is sealed or closed by the elastic closing member 111. This substantially prevents atmospheric air from remaining in the supply passage 79 after the nozzle main body 71 is separated from the FOUP 7. The opening/closing mechanism 110 functions as a check valve, and a known check valve may be used as the opening/closing mechanism 110.

Figure 15:
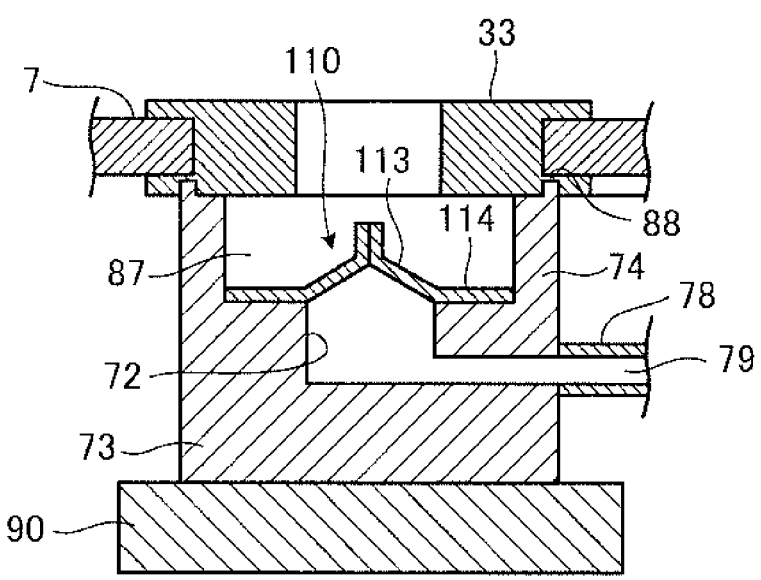
FIG. 15 is a cross section of a gas injection device with another elastic closing member which is different from that shown in FIG. 13.

The opening/closing mechanism 110 may be further modified as shown in FIG. 15. This opening/closing mechanism 110 includes: an elastic closing member 113 including central portions configured to come into close contact with each other so as to seal or close the gas supply port 72; and a fixing portion 114 provided radially outside of the elastic closing member 113 and fixing the elastic closing member 113 to the barrel portion 73.

Figure 16:
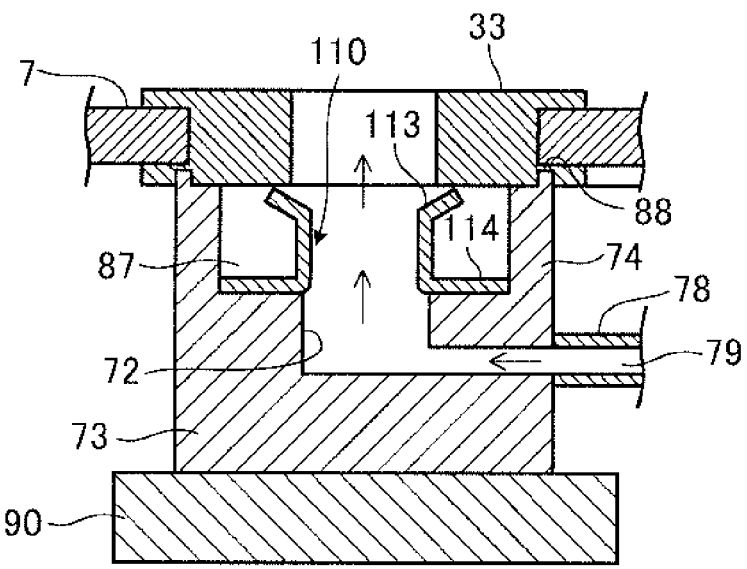
FIG. 16 is a cross section illustrating a state in which the elastic closing member is

This opening/closing mechanism 110 is configured as follows. As nitrogen gas is supplied to flow from the supply nozzle 78 to the upper space 87, as shown in FIG. 16, the pressure of the nitrogen gas elastically deforms and bends the elastic closing member 113 outward, with the result that the seal at the gas supply port 72 is opened. Thus, it is possible to supply nitrogen gas to the FOUP 7 with a simple structure.

Figure 17:
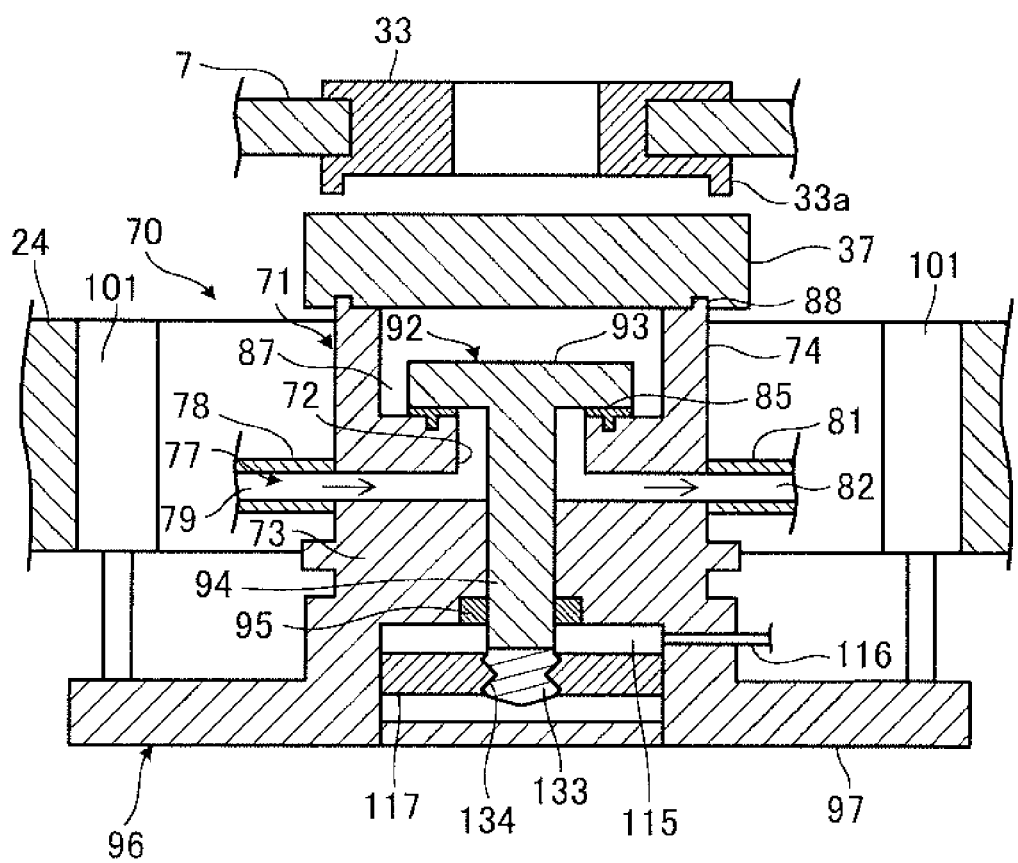
FIG. 17 is a cross section of a gas injection device of another variant embodiment in which a pressure chamber is provided instead of springs.

In the above-described embodiment, the springs 102 bias the nozzle main body 71 upward relative to the support member 97, and this maintains the gas supply port 72 sealed or closed by the opening/closing mechanism 92. However, this arrangement is not essential. Instead of the springs 102, a pressure chamber 115 may be provided as a biasing member to open/close the gas supply port 72. As shown in FIG. 17, the pressure chamber 115 is provided between the support member 97, which is unitary with the nozzle main body 71, and the barrel portion 73. The pressure chamber 115 is connected to a pressure adjusting nozzle 116 configured to supply/discharge gas.

The pressure adjusting nozzle 116 is configured to supply gas to the pressure chamber 115 to increase the pressure therein, and pushes a lower end portion 117 of the opening/closing mechanism 92 downward to bias the opening/closing mechanism 92 downward. This causes the lid portion 93 to seal or close the gas supply port 72. Meanwhile, as the pressure adjusting nozzle 116 discharges gas from the pressure chamber 115, the pressure therein decreases. The negative pressure pulls the lower end portion 117 upward, to move the opening/closing mechanism 92 upward. This opens the gas supply port 72 sealed or closed by the lid portion 93.

In the above-described embodiment, the elastic member called grommet-type member is used as each gas supply valve 33 of the FOUP 7. In this regard, however, a so-called lip-type member made of material having high stiffness such as metal and plastic may be used as each gas supply valve 33. In this case, the upper end of the corresponding gas injection device 70 is formed by an elastic member 37 similarly to the grommet-type member. Thus, the gas supply valve 33 is formed by a stiff member and the upper end of the gas injection device 70 is formed by an elastic member; or both of them are formed by elastic members. With this arrangement, when the upper end of each gas injection device 70 is brought into contact with the corresponding gas supply valve 33, a protrusion 33a of the gas supply valve 33 contacts the elastic member 37, to provide hermeticity. This prevents nitrogen gas to be supplied to the FOUP 7 from leaking to the outside.

In the above-described embodiment, the opener 96 and the opening/closing mechanism 92 are formed unitarily. However, to facilitate assembling, these elements may be formed as separate members. For example, these elements may be structured to respectively include a male thread portion 133 and a female thread portion 134 so that the position of the opening/closing mechanism 92 relative to the opener 96 is restricted, and so as to be attachable to/detachable from each other. This facilitates assembling and replacement of the opening/closing mechanism 92.

Figure 18:
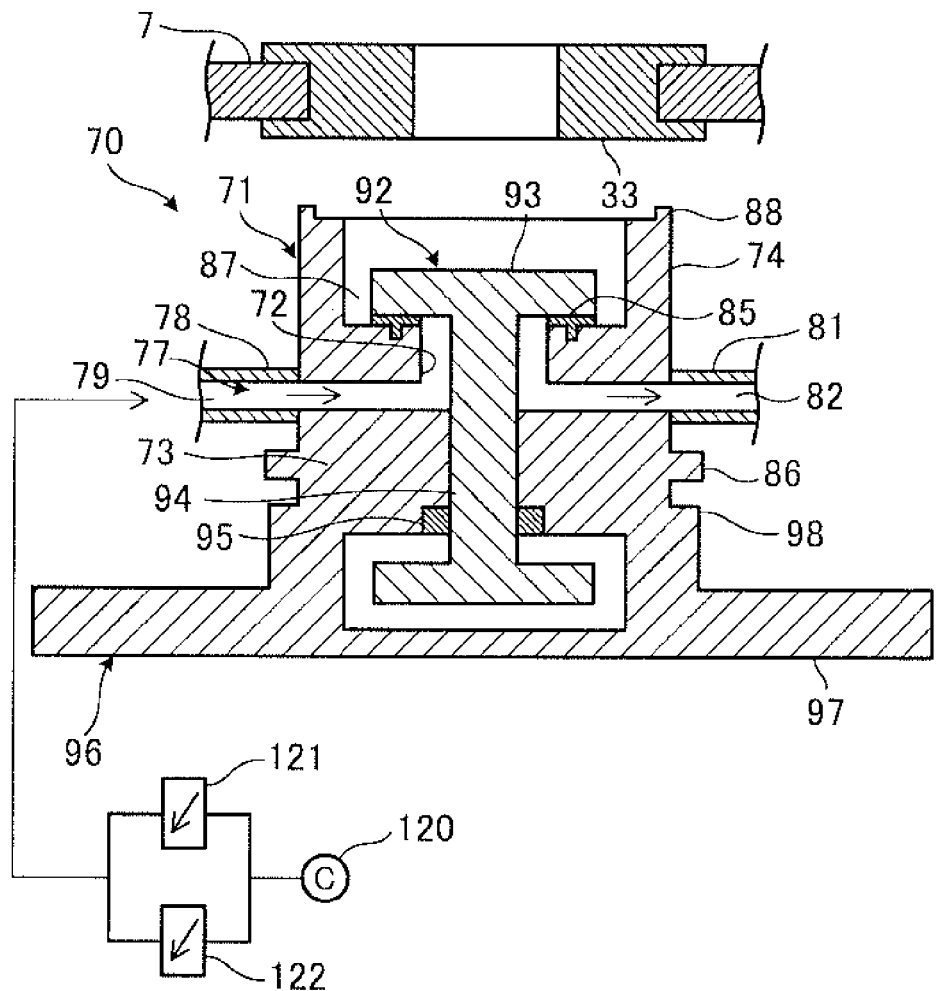
FIG. 18 is a cross section of a gas injection device of still another variant embodiment in which a regulator configured to open/close a gas supply port is provided.

Furthermore, the gas supply port 72 may be sealed (closed)/opened by adjusting the pressure of the nitrogen gas in the gas passage 77. Specifically, as shown in FIG. 18, a first regulator 121 and a second regulator 122 that are parallel-connected to a flow rate controller 120 are coupled to the supply nozzle 78. In this arrangement, when the first regulator 121 configured to eject high-pressure nitrogen gas is driven, high-pressure nitrogen gas flows through the supply nozzle 78. The pressure of the nitrogen gas moves the opening/closing mechanism 92 upward, to open the gas supply port 72 sealed or closed by the lid portion 93. At this time, the discharge valve 83 is closed. Meanwhile, when the second regulator 122 configured to eject low-pressure nitrogen gas is driven, low-pressure nitrogen gas flows through the supply nozzle 78. The low-pressure nitrogen gas moves the opening/closing mechanism 92 downward, to seal or close the gas supply port 72 with the lid portion 93.

Figure 19:
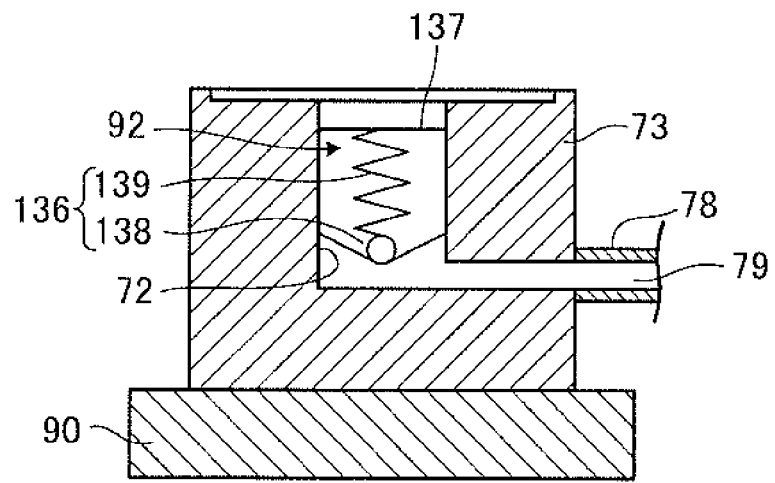
FIG. 19 is a cross section of a part of a gas injection device of still another variant embodiment in which a check valve is used as an opening/closing mechanism.

As shown in FIG. 19, a check valve 136 may be used as an element of the opening/closing mechanism 92. The opening/closing mechanism 92 includes the check valve 136 and a fixing portion 137 that fixes the check valve 136 to the gas supply port 72. The check valve 136 includes: a ball 138 fitted in the gas supply port 72 and configured to prevent nitrogen gas from flowing downward; and a plunger 139 configured to move the ball 138 upward to create a path for nitrogen gas.

Figure 20:
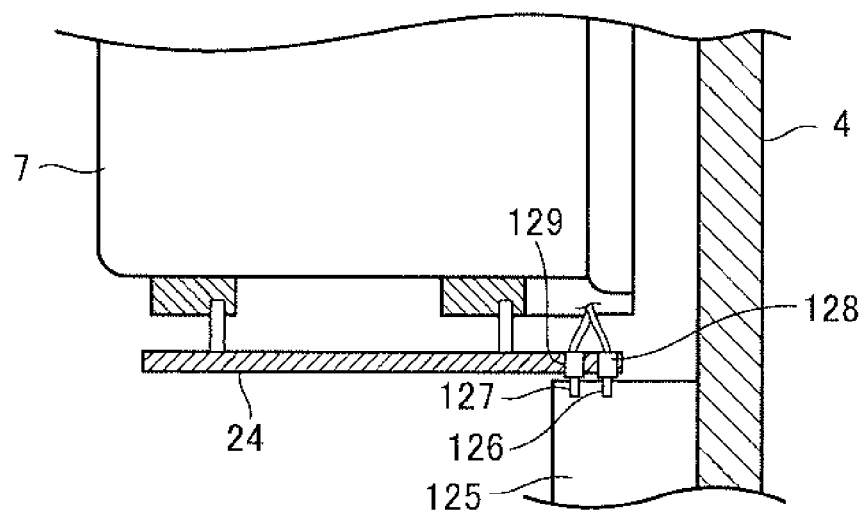
FIG. 20 is a cross section of a table with its surroundings according to a variant embodiment in which a gas replacement mechanism is not movable up and down but is fixed.

In the above-described embodiment, each gas injection device 70 is raised/lowered by the air cylinders 101. However, each gas injection device 70 may be arranged so as not to be raised/lowered. As shown in FIG. 20, a gas replacement mechanism 125 includes a not-shown gas supplying device filled with nitrogen gas, and is configured to supply nitrogen gas into the FOUP 7 placed on the table 24. The gas replacement mechanism 125 is provided with a gas supply port 126 and a gas discharge port 127. The gas supply port 126 is connected to an intake purge port 128 of the table 24, and the gas discharge port 127 is connected to an exhaust purge port 129 of the table 24. Thus, the gas supply port 126 and the gas discharge port 127 are fixed to the table 24, and therefore the mechanism is structured so as not to be raised/lowered.

Figure 21:
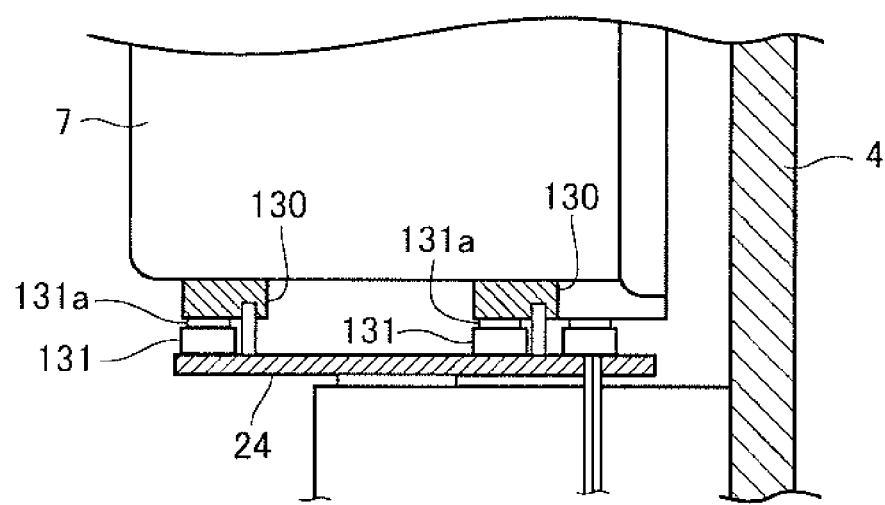
FIG. 21 is a cross section of a table with its surroundings according to another variant embodiment in which pressure sensors are used as positioning sensors.

In the embodiment described above, whether the FOUP 7 has been properly positioned is detected by the positioning sensors 60. However, whether the FOUP 7 has been properly positioned may be detected in another way. For example, as shown in FIG. 21, the proper positioning may be checked by detecting whether a press portion 131a of each pressure sensor 131 provided on an upper portion of the table 24 is pressed by a corresponding protrusion 130 provided on the bottom portion of the FOUP 7.

While in the above-described embodiment, nitrogen gas is used as inert gas by way of example, desired gas such as other dry gas and argon gas may be used.

While in the above-described embodiment, optical sensors and pressure sensors are mentioned as an example of the positioning sensors, other sensors such as mechanical sensors and electrical sensors may be used as the positioning sensors.

The above-described embodiment deals with the case in which the gas injection devices are used in the load port. However, one or more gas injection devices may be applied to other devices or apparatuses such as: purge station systems (purging devices) each configured to supply inert gas into a FOUP; FOUP stockers each including a plurality of tables and configured to store FOUPs; and buffers on which one or more FOUPs are temporarily placed.

REFERENCE SIGNS LIST

70: gas injection device
71: nozzle main body
72: gas supply port
73: barrel portion
77: gas passage
81: first discharge nozzle (discharge unit)
87: upper space
89: lower space
92: opening/closing mechanism
93: lid portion
94: elongate portion 96: opener
97: support member (support portion)
102: spring (biasing member)
111: elastic closing member
112: fixing portion

The invention claimed is:

1. A gas injection device provided at a table on which a container having a lid member is placed, comprising:
a nozzle main body including a gas supply port through which inert gas is supplied to a content containing space of the container and a gas passage communicating with the gas supply port;
an opening/closing mechanism configured to open/close the gas supply port; and
an opener configured to cause the opening/closing mechanism to open the gas supply port closed by the opening/closing mechanism,
wherein the nozzle main body moves up and down relative to the container, in a state in which the gas supply port is sealed by the opening/closing mechanism,
wherein the nozzle main body and the opening/closing mechanism are provided at the table,
wherein the gas injection device further includes a discharge unit communicating with the gas passage and configured to discharge gas from the gas passage with the gas supply ort closed, and
wherein, the inert gas is supplied to the gas passage and the discharge unit discharges the gas from the gas passage while the gas supply port is closed by the opening/closing mechanism and the container and the nozzle main body are separated from each other, with the result that the gas in the gas passage is replaced.

2. The gas injection device according to claim 1, wherein the nozzle main body includes:
a barrel portion forming the gas supply port;
an upper space provided in an upper portion of the barrel portion; and
a lower space provided in a lower portion of the barrel portion,
the opening/closing mechanism includes:
a lid portion provided in the upper space and configured to cover a perimeter of the gas supply port with an outer circumferential edge portion of the lid portion; and
an elongate portion extending from the lid portion to the lower space through the barrel portion, and
the opener includes
a support portion provided in and around the lower space so as to be movable in an up-down direction relative to the barrel portion and configured to move a lower end of the elongate portion upward.

3. The gas injection device according to claim 2 further comprising a biasing member provided between the barrel portion and the opener, wherein
the opener fixed to the lower end of the elongate portion is configured to move the opening/closing mechanism upward against a biasing force of the biasing member.

4. The gas injection device according to claim 1, wherein the nozzle main body includes:
a barrel portion forming the gas supply port; and
an upper space provided in an upper portion of the barrel portion,
the opening/closing mechanism includes:
a lid portion provided in the upper space and configured to close the gas supply port; and
a fixing portion fixing the lid portion to the barrel portion, wherein,
the lid portion is an elastic closing member, and
the opener is inert gas configured to open the closed gas supply port by elastically deforming the lid portion.

5. The gas injection device according to claim 1, wherein after the discharge unit discharges the gas and
after an upper end of the nozzle main body is brought into contact with a container containing content,
the opener causes the opening/closing mechanism to open the gas supply port closed by the opening/closing mechanism, and
gas injection to the container is started.

6. The gas injection device according to claim 5, wherein after the gas injection to the container is finished, the opening/closing mechanism closes the gas supply port.

7. The gas injection device according to claim 1, wherein the opening/closing mechanism includes:
a lid portion which creates, at an outer circumferential edge portion, a seal at the perimeter of the gas supply port; and
an elongate portion which extends from the lid portion, the opener is fixed to the elongate portion and is in synchronization with the opening/closing mechanism, and the lid portion opens and closes the gas supply port.

8. A gas injection device provided at a load port which is configured to open/close a lid member of a container placed on a table, comprising:
a nozzle main body including a gas supply port through which inert gas is supplied to a content containing space of the container and a gas passage communicating with the gas supply port;
an opening/closing mechanism configured to open/close the gas supply port; and
an opener configured to cause the opening/closing mechanism to open the gas supply port closed by the opening/closing mechanism,
wherein, the nozzle main body moves up and down relative to the container, in a state in which the gas supply port is sealed by the opening/closing mechanism,
wherein the nozzle main body and the opening/closing mechanism are provided at the table,
wherein the gas injection device further includes a discharge unit communicating with the gas passage and configured to discharge gas from the gas passage with the gas supply port closed, and
wherein, the inert gas is supplied to the gas passage and the discharge unit discharges the gas from the gas passage while the gas supply port is closed by the opening/closing mechanism and the container and the nozzle main body are separated from each other, with the result that the gas in the gas passage is replaced.

* * * * *